United States Patent
Combi et al.

(10) Patent No.: US 7,489,004 B2
(45) Date of Patent: Feb. 10, 2009

(54) MICRO-ELECTRO-MECHANICAL VARIABLE CAPACITOR FOR RADIO FREQUENCY APPLICATIONS WITH REDUCED INFLUENCE OF A SURFACE ROUGHNESS

(75) Inventors: Chantal Combi, Oggiono (IT); Andrea Rusconi Clerici Beltrami, Milan (IT); Benedetto Vigna, Pietrapertosa (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 345 days.

(21) Appl. No.: 11/338,427

(22) Filed: Jan. 24, 2006

(65) Prior Publication Data

US 2007/0183116 A1 Aug. 9, 2007

(51) Int. Cl.
*H01L 27/108* (2006.01)
*H01L 29/94* (2006.01)
(52) U.S. Cl. .............. 257/312; 257/414; 257/415; 257/595; 438/52; 438/48; 438/53
(58) Field of Classification Search .......... 257/312, 257/414, 415, 595; 438/48, 52, 53
See application file for complete search history.

(56) References Cited

U.S. PATENT DOCUMENTS

| 6,661,069 | B1* | 12/2003 | Chinthakindi et al. ...... 257/415 |
| 7,260,424 | B2* | 8/2007 | Schmidt .................. 455/575.7 |
| 2005/0194867 | A1* | 9/2005 | Kawakubo et al. ......... 310/348 |
| 2005/0224916 | A1* | 10/2005 | Musalem et al. ........... 257/595 |
| 2005/0242687 | A1* | 11/2005 | Kawakubo et al. ......... 310/324 |
| 2006/0119227 | A1* | 6/2006 | Ikehashi .................... 310/348 |
| 2006/0291134 | A1* | 12/2006 | Plowman et al. ......... 361/283.4 |
| 2006/0291135 | A1* | 12/2006 | Musalem et al. ......... 361/283.4 |

FOREIGN PATENT DOCUMENTS

WO WO 2004114345 A2 * 12/2004

OTHER PUBLICATIONS

Hijazi et al. "Design of a Superconducting MEM Shunt Switch for RF Applications", Jun. 2003, IEEE Transactions of Applied Superconductivity, vol. 13, No. 2, pp. 696-699.*
Tan et al. "A DC-Contact MEMS Shunt Switch", Jun. 2002, IEEE Microwave and Wireless Components Letters, vol. 12, No. 6, pp. 212-214.*

* cited by examiner

*Primary Examiner*—M. Wilczewski
*Assistant Examiner*—Telly D Green
(74) *Attorney, Agent, or Firm*—Lisa K. Jorgenson; Seed IP Law Group PLLC; Eric M. Ringer

(57) ABSTRACT

A micro-electro-mechanical variable capacitor has a first and a second electrode, and a dielectric region arranged on the first electrode. An intermediate electrode is arranged on the dielectric region. The first electrode is fixed and anchored to a substrate, and the second electrode includes a membrane movable with respect to the first electrode according to an external actuation, in particular an electrostatic force due to an actuation voltage applied between an actuation electrode and the first electrode. The second electrode is suspended over the intermediate electrode in a first operating condition, and contacts the intermediate electrode in a second operating condition; in particular, in the second operating condition, a short-circuit is established between the second electrode and the intermediate electrode.

19 Claims, 2 Drawing Sheets

MICRO-ELECTRO-MECHANICAL VARIABLE CAPACITOR FOR RADIO FREQUENCY APPLICATIONS WITH REDUCED INFLUENCE OF A SURFACE ROUGHNESS

BACKGROUND OF THE INVENTION

1. Field of the Invention

The present invention relates to a micro-electro-mechanical (MEMS) variable capacitor with reduced influence of a surface roughness, in particular for radio frequency (RF) applications, to which the following description will make explicit reference without this, however, implying any loss in generality.

2. Description of the Related Art

As is known, in the last few years MEMS devices have been developed for a wide variety of applications, in view of their size, cost and power consumption advantages. In particular, variable capacitors (the so called "varicaps") manufactured using MEMS technology have been successfully introduced in RF applications (such as in wireless mobile communication), instead of conventional variable capacitors, such as junction diodes or MOS capacitors. For example, MEMS variable capacitors have been used in shunt antenna switches, tunable filters, and voltage-controlled oscillators.

FIG. 1 illustrates a cross section of a variable capacitor 1, of a MEMS type. In detail, the variable capacitor 1 comprises a fixed electrode 2 and a movable electrode 3, of conductive material (e.g., aluminum, gold or nickel) or a combination of a dielectric material (e.g., oxide or nitride) and a conductive material, which constitute respectively the top and bottom plates of the variable capacitor having a capacitance C. The fixed electrode 2 is arranged on, and fixed to, a dielectric layer 4 (e.g., of silicon oxide) formed on a substrate 5, for example of semiconductor material (silicon) or glass; a dielectric region 6 (e.g., of silicon oxide or nitride) locally coats the fixed electrode 2. The movable electrode 3 is a membrane, which is suspended over the fixed electrode 2, and is spaced apart from the dielectric region 6 by an interelectrode air gap 7, having a thickness $d_g$. The movable electrode 3 is electrically connected to actuation electrodes 8 which are arranged on the dielectric layer 4 laterally to the fixed electrode 2; the actuation electrodes 8 mechanically anchor the movable electrode 3 to the substrate 5. At least part of the membrane is perforated (in a not shown manner) in order to allow releasing of the membrane by etching of a sacrificial region, during a related manufacturing process.

During operation, a dc actuation voltage $V_{dc}$ is applied across the plates of the variable capacitor 1 by means of the actuation electrodes 8, resulting in an electrostatic force between the fixed electrode 2 (bottom plate) and the movable electrode 3 (top plate). This electrostatic force pulls the movable electrode 3 towards the fixed electrode 2, determining a decrease of the thickness $d_g$ of the interelectrode air gap 7 and a corresponding increase of the capacitance value; in particular, the movable electrode 3 is pulled down to a position at which an equilibrium is reached between the electrostatic force due to the applied actuation voltage $V_{dc}$ and an elastic force generated in the membrane. As shown in FIGS. 2a-2b, as long as the actuation voltage remains below a critical value, generally called the pull-in voltage (denoted with $V_{pi}$), the amount of displacement of the movable electrode 3 is a result of the equilibrium between the electrostatic force and the elastic force in the membrane. In this operating region (shown in the enlarged detail of FIG. 2b), the variable capacitor 1 acts as a tuneable capacitor, and the capacitance C shows an increasing trend with the actuation voltage $V_{dc}$. When the actuation voltage $V_{dc}$ exceeds the pull-in voltage $V_{pi}$, no equilibrium can be reached any more, and the movable electrode 3 collapses on the dielectric region 6 coating the fixed electrode 2, as shown in FIG. 3.

This situation is unwanted for a tuneable capacitor, but it is the normal operation of a capacitive switch, which has two operating states: the on-state, for actuation voltages below the pull-in voltage $V_{pi}$, and the off-state, for actuation voltages above the pull-in voltage $V_{pi}$. In particular, a minimum capacitance value $C_{min}$ is associated to the on-state, and a maximum capacitance value $C_{max}$ is associated to the off-state; the ratio between the maximum capacitance value $C_{max}$ and the minimum capacitance value $C_{min}$ is generally called the switching ratio (denoted with SR) of the variable capacitor 1, and is to be maximized for optimum operation of the capacitive switch (typically, the switching ratio is between 10 and 50).

An important factor that influences the maximum capacitance value $C_{max}$ (and the switching ratio) is the roughness of the facing surfaces of both the movable electrode 3 and the dielectric region 6. In particular, if surfaces were flat and without roughness, the maximum capacitance value $C_{max}$ associated to the off-state of the variable capacitor 1 would be:

$$C_{\max} = \varepsilon_0 \cdot \varepsilon_r \frac{S}{d}$$

wherein $\varepsilon_0$ is the absolute dielectric constant (dielectric permittivity in vacuum), $\varepsilon_r$ is the electric permittivity of the dielectric region 6, S is the facing area of the electrodes, and d is the thickness of the dielectric region 6. In particular, this maximum capacitance value $C_{max}$ corresponds to a capacitance $C_{diel}$ due to the dielectric region 6.

However, if the above surfaces have a certain amount of roughness, as shown in the detail of FIG. 4, they do not perfectly adhere to each other and gap regions 10 filled with air are formed between the movable electrode 3 and the dielectric region 6, and an unwanted capacitance $C_{air}$ due to the air that fills the gap regions 10, is generated in series to the capacitance $C_{diel}$ due to the dielectric region 6. Since the electric permittivity of air is equal to 1, the resulting value of the maximum capacitance $C'_{max}$ is strongly decreased by the presence of air, according to the formula:

$$C'_{\max} = \left( \frac{C_{diel} \cdot C_{air}}{C_{diel} + C_{air}} \right)$$

$C'_{max}$ being much lower than $C_{max}$.

Accordingly, the switching ratio of the variable capacitor 1 is decreased with respect to a design value, and so are the electrical performances thereof, due to the presence of the surface roughness.

BRIEF SUMMARY OF THE INVENTION

One embodiment of the present invention provides a MEMS variable capacitor that will enable the aforementioned disadvantages and problems to be overcome, and in particular that will show a reduced dependence on the roughness of the surfaces of the electrode and dielectric region.

According to one embodiment of the present invention, a micro-electro-mechanical variable capacitor comprises a first and a second electrode, configured to be spaced apart at a distance varying according to an external actuation, and a dielectric region arranged on said first electrode; the variable capacitor further includes an intermediate electrode arranged on said dielectric region.

According to another embodiment of the present invention, a micro-electro-mechanical capacitive switch implemented on a RF transmission line, having a signal line and a ground line, comprises a dielectric region arranged on said signal line and a movable electrode electrically connected to said ground line, said movable electrode and said signal line configured to be spaced apart at a distance varying according to an external actuation; the capacitive switch further includes an intermediate electrode arranged on said dielectric region.

According to a further embodiment of the present invention, a process for manufacturing a micro-electro-mechanical variable capacitor comprises forming a first electrode on a supporting layer, forming a second electrode, suspended over said first electrode and free to move with respect to said first electrode, and forming a dielectric region on said first electrode; the process further includes forming an intermediate electrode on said dielectric region.

According to still another embodiment of the present invention, a process for manufacturing a micro-electro-mechanical variable capacitor comprises forming, on a supporting layer, a Metal Insulator Metal (MIM) capacitor having a top plate, and forming a movable electrode, suspended over said top plate and free to move with respect to said top plate.

According to another embodiment of the present invention, a process for manufacturing a micro-electro-mechanical capacitive switch on a RF transmission line, having a signal line and a ground line, comprises forming a dielectric region on said signal line, and forming a movable electrode electrically connected to said ground line and suspended over said signal line and free to move with respect to said signal line; the process further includes forming an intermediate electrode on said dielectric region.

According to a further embodiment of the present invention, a method for varying a capacitance value of a micro-electro-mechanical variable capacitor comprises varying said capacitance value between at least an on-state value and an off-state value, higher than said on-state value; wherein varying said capacitance value comprises assigning to said off-state value the capacitance value of a Metal Insulator Metal (MIM) capacitor.

BRIEF DESCRIPTION OF THE SEVERAL VIEWS OF THE DRAWING(S)

For a better understanding of the present invention, preferred embodiments thereof are now described, purely by way of non-limiting example and with reference to the attached drawings, wherein.

DETAILED DESCRIPTION OF THE INVENTION

Figure 1:
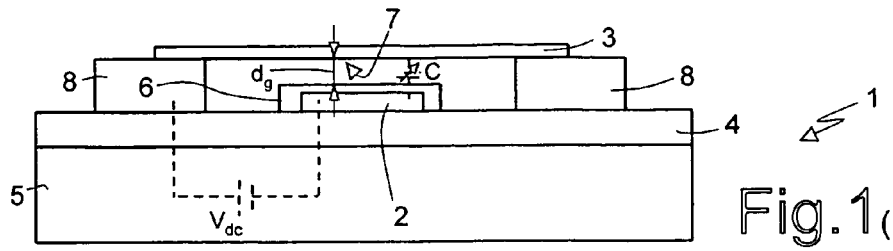
FIG. 1 is a cross-sectional view of a micro-electromechanical variable capacitor of a known type, in a first operating condition.
Figure 2A:
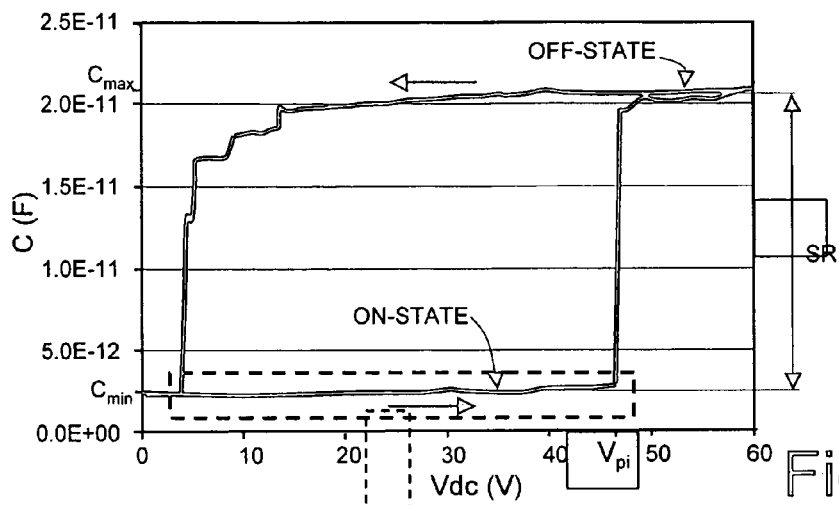
FIGS. 2a-2b show plots of electrical quantities associated to the variable capacitor of FIG. 1.
Figure 2B:
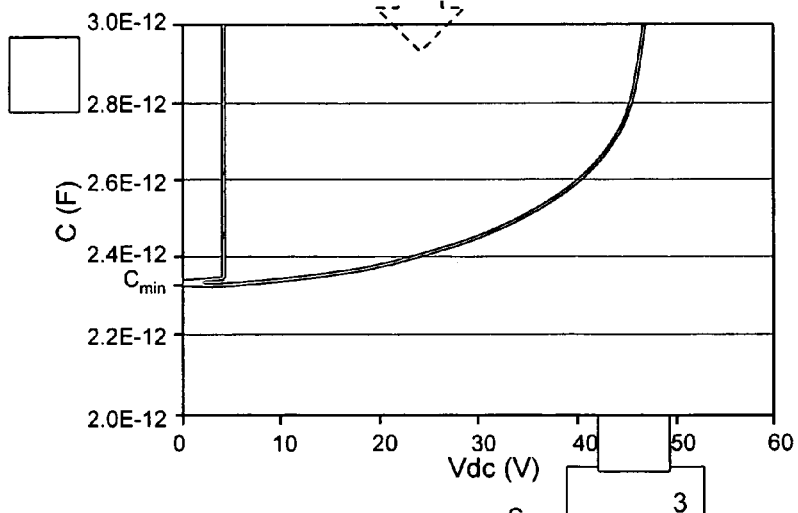
Figure 3:
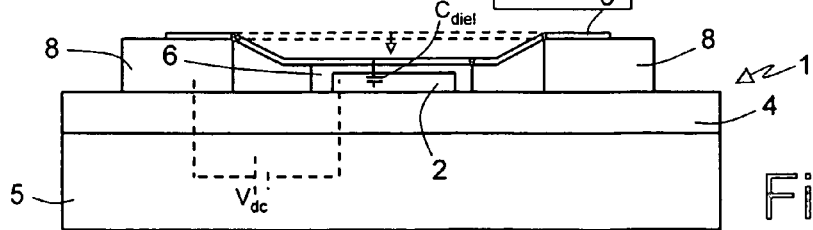
FIG. 3 is a cross-sectional view of the variable capacitor of FIG. 1, in a second operating condition.
Figure 4:
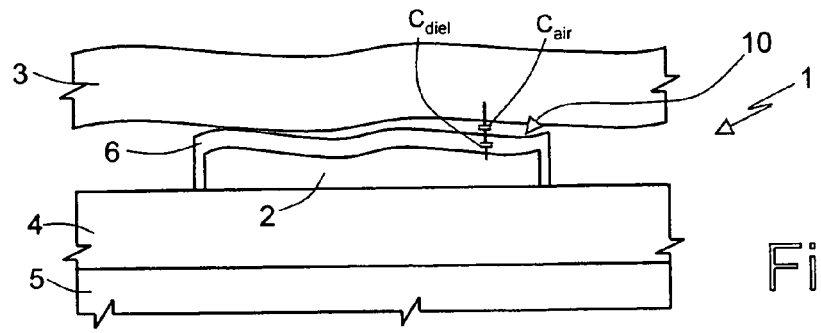
FIG. 4 is a cross-sectional view at an enlarged scale of a portion of the variable capacitor of FIG. 3, showing a surface roughness thereof.
Figure 5:
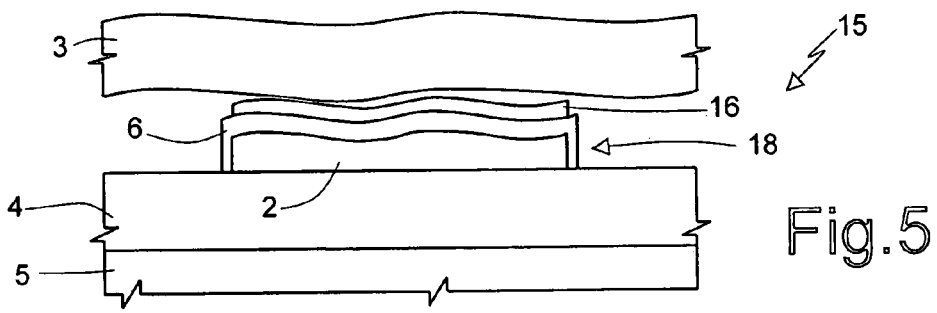
FIG. 5 is a cross sectional view similar to that of FIG. 4 of a portion of a MEMS variable capacitor according to an embodiment of the present invention.

FIG. 5, in which parts that are similar to those described previously are designated by the same reference numbers, shows a variable capacitor 15 according to an embodiment of the present invention. In particular, the variable capacitor 15 differs from the capacitor described previously for the presence of an intermediate electrode 16 of conductive material, which is arranged on the dielectric region 6 coating the fixed electrode 2. The intermediate electrode 16, for example made of aluminum, gold, or nickel (or any other suitable metallic material or combination of a dielectric and a metallic material), is formed on the dielectric region 6 so that it perfectly adheres to a top surface thereof, with no air gaps therebetween. In detail, the intermediate electrode 16 is formed via evaporation or sputtering (or other suitable deposition techniques), through a deposition mask which leaves uncovered only the top surface of the dielectric region 6. A main dimension of the intermediate electrode 16 in the cross-section of FIG. 4 corresponds, for example, to a corresponding main dimension of the fixed electrode 2.

Accordingly, a MIM (Metal-Insulator-Metal) capacitor 18 is formed on the dielectric layer 4, having the intermediate electrode 16 as top plate, the fixed electrode 2 as bottom plate, and the dielectric region 6 as interelectrode dielectric; the capacitance of the MIM capacitor 18 is determined by the thickness d of the dielectric region 6, and can be accurately set in a design stage.

During operation, when an actuation voltage $V_{dc}$, having a value higher than a pull-in voltage $V_{pi}$, is applied to actuation electrodes 8, the movable electrode 3 collapses, for the reasons previously described, on the intermediate electrode 16 (as shown in FIG. 5). Therefore, a short-circuit is established between the movable electrode 3 and the intermediate electrode 16 (the top plate of the variable capacitor 15 being formed by the assembly of the moveable electrode 3 and the intermediate electrode 16), and hence the maximum capacitance value $C_{max}$ associated to the off-state of the variable capacitor 15 is equal to the capacitance of the MIM capacitor 18. In other words, the series capacitance due to the presence of the air-filled gap regions due to the surface roughness, is no more involved in the determination of the off-state capacitance of the variable capacitor 15.

Figure 6:
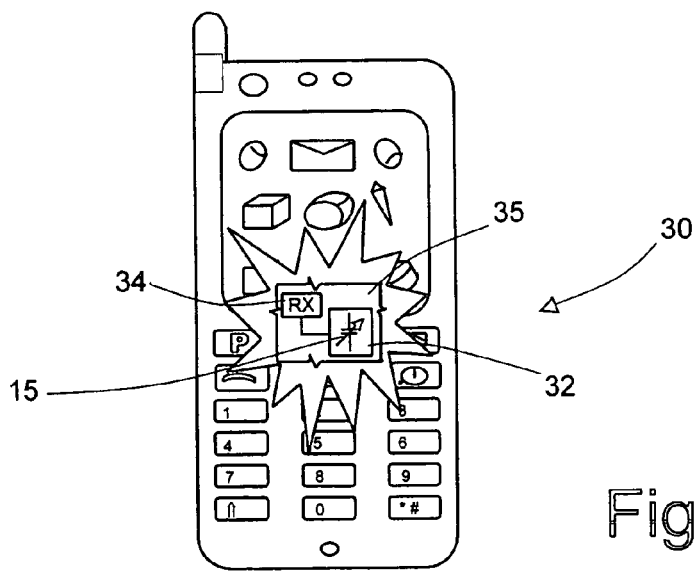
FIG. 6 is a schematic representation of an electronic device, in particular a mobile phone, incorporating the MEMS variable capacitor of FIG. 5.

Since the maximum capacitance value, and accordingly the switching ratio of the variable capacitor 15, can be set in the design stage and it is not reduced by the above discussed roughness issues, the variable capacitor according to the present invention can be advantageously used as a capacitive switch for RF applications, for example as a shunt switch in a mobile phone 30, see FIG. 6, to allow/block transmission of a received RF signal. The variable capacitor 15 can be integrated in a chip 32 with other suitable electronics, and the chip 32 can be coupled to a receiving (RX) circuit 34 of the mobile phone 30 (in particular, both the chip 32 and the receiving circuit 34 being connected to a printed circuit board 35 arranged inside a housing of the mobile phone 30).

Figure 7:
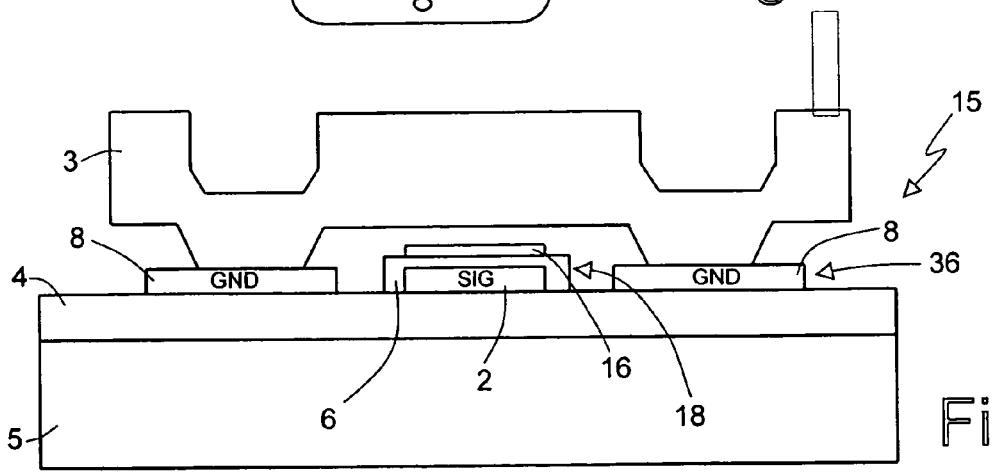
FIG. 7 is a cross sectional view of a MEMS variable capacitor for RF applications, used as a capacitive switch.

As shown in FIG. 7, in this application, the variable capacitor 15 is implemented on a co-planar waveguide (CPW) transmission line 36, which is provided for the transmission of the received RF signal; the CPW transmission line 36 is arranged on the dielectric layer 4 and includes a signal line (including the fixed electrode 2), and ground lines (including the actuation electrodes 8) arranged laterally with respect to the signal line (both the signal and ground lines being formed at a same metal level). The movable electrode 3 is electrically connected, and mechanically anchored, to the ground lines, and it is arranged as a bridge crossing over the signal line. When the bridge is up (i.e., the actuation voltage $V_{dc}$ has a value which is lower than the pull-in voltage $V_{pi}$), the capacitance of the signal line to ground is low (e.g., on the order of 10-100 fF), the capacitive switch is in the on-state, and hardly affects the impedance of the line, so allowing passage of the RF signal. Upon activation (actuation voltage $V_{dc}$ higher than the pull-in voltage $V_{pi}$), the bridge is pulled down onto the intermediate electrode 16, the capacitance becomes high and the capacitive switch turns to the off-state, shunting the RF signal to ground. In particular, during operation, the RF signal and the actuation voltage $V_{dc}$ are superimposed and applied to the signal line; in any case, the RF signal does not influence the displacement of the movable electrode 3, since it is filtered by the large mechanical time constant of the capacitor structure.

The advantages of the described micro-electro-mechanical variable capacitor are clear from the foregoing description.

In particular, the variable capacitor 15 is no more roughness dependent, and the maximum capacitance value $C_{max}$ associated to the off-state (and so the switching ratio) can be accurately set in a design stage, by properly sizing the MIM capacitor 18.

The manufacturing of the variable capacitor requires a simple additional manufacturing step, and in particular only one more deposition mask is required.

Moreover, the intermediate electrode 16 offers a mechanical protection for the underlying dielectric region 6.

Finally, it is clear that modifications and variations may be made to what is described and illustrated herein, without thereby departing from the scope of the present invention, as defined in the annexed claims.

For example, in a per se known manner, actuation of the movable electrode 3 could be provided by electro-thermal actuators, and/or the movable electrode could be anchored to the substrate via additional elastic elements.

The dielectric layer could not be envisaged, in case substrates made of glass or other insulating material were used.

Furthermore, in the CPW implementation, the variable capacitor 15 could provide a capacitive switch arranged in series to the signal line; in this case, the condition of maximum capacitance would be associated to the on-state of the switch, allowing passage of the RF signal.

The capacitive switch could also be implemented on a micro-strip transmission line, or any other kind of transmission line.

Furthermore, the variable capacitor can be used both as a tuneable capacitor and as a switched capacitor. In particular, in the described mobile phone application, the variable capacitor could also be used in a tuning stage of the receiving circuit 34.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

The invention claimed is:

1. A micro-electro-mechanical variable capacitor, comprising:
   a fixed first electrode;
   a second electrode configured to be spaced apart from the fixed first electrode at a distance varying according to an external actuation and having a membrane configured to be movable with respect to said first electrode according to said external actuation;
   a fixed dielectric region arranged on said first electrode; and
   a fixed intermediate electrode arranged on and fixed on said dielectric region, said second electrode configured to be suspended over and separated by a gap from said intermediate electrode in a first operating condition, and to electrically contact said second surface of said intermediate electrode in a second operating condition, a short-circuit being established between said second electrode and said intermediate electrode in said second operating condition.

2. The micro-electro-mechanical variable capacitor of claim 1, wherein a maximum capacitance value is associated to said second operating condition.

3. The micro-electro-mechanical variable capacitor of claim 1, wherein said first electrode is fixed to a supporting layer, and said dielectric region coats said first electrode; and wherein said second electrode is electrically connected and mechanically anchored to an actuation electrode fixed to said supporting layer, and said external actuation is an electrostatic force generated by application of an actuation voltage between said actuation electrode and said first electrode.

4. The micro-electro-mechanical variable capacitor of claim 3, wherein said supporting layer includes a dielectric layer formed on a substrate; said first electrode being arranged on said dielectric layer, and said actuation electrode being arranged on said dielectric layer laterally with respect to said first electrode.

5. The micro-electro-mechanical variable capacitor of claim 1, wherein said first electrode, said dielectric region and said intermediate electrode together form a Metal Insulator Metal (MIM) capacitor.

6. The micro-electro-mechanical variable capacitor of claim 1, wherein said intermediate electrode includes metallic material, in particular aluminum, gold, or nickel.

7. The micro-electro-mechanical variable capacitor of claim 1, wherein said first electrode is part of a RF transmission line for transmission of a RF signal; said micro-electro-mechanical variable capacitor being configured to act as a capacitive switch for said RF transmission line.

8. The micro-electro-mechanical variable capacitor of claim 7, wherein said transmission line is a co-planar wave guide (CPW) and includes a signal line and a ground line arranged on a supporting layer; said second electrode being electrically connected and mechanically anchored to an actuation electrode fixed to said supporting layer, and said external actuation being an electrostatic force generated by application of an actuation voltage between said actuation electrode and said first electrode; and wherein said first electrode is part of said signal line and said actuation electrode is part of said ground line, said second electrode being arranged as a bridge over said signal line.

9. The micro-electro-mechanical variable capacitor of claim 8, wherein said second electrode is configured to be suspended over said intermediate electrode in a first operating condition and to contact said intermediate electrode in a second operating condition, a short-circuit being established between said second electrode and said intermediate electrode in said second operating condition; and wherein a first capacitance value, allowing passage of said RF signal through said signal line, is associated to said first operating condition, and a second capacitance value, higher than said first capacitance value and blocking said RF signal, is associated to said second operating condition.

10. A mobile phone, comprising:
a receiving circuit that receives an RF signal; and
a micro-electro-mechanical variable capacitor that includes:
a fixed first electrode,
a dielectric region arranged on at least a portion of the first fixed electrode,
a second electrode configured to be spaced apart at a distance varying according to an external actuation from the fixed first electrode, and
a fixed intermediate electrode arranged on and fixed on said dielectric region of the first fixed electrode, wherein a gap extends between the intermediate electrode and the second electrode in a first operating condition of the micro-electro-mechanical variable capacitor, and wherein the intermediate electrode is electrically contacted by the second electrode in a second operating condition of the micro-electro-mechanical variable capacitor.

11. A micro-electro-mechanical capacitive switch implemented on a RF transmission line having a signal line and a ground line, comprising a dielectric region arranged on said signal line and a movable electrode electrically connected to said ground line, said movable electrode and said signal line configured to be spaced apart at a distance varying according to an external actuation; further including a fixed intermediate electrode arranged on and fixed on said dielectric region, the intermediate electrode separated from the moveable electrode in a first operating condition of the micro-electro-mechanical capacitive switch and electrically contacted by at least a portion of the moveable electrode in a second operating condition of the micro-electro-mechanical capacitive switch.

12. The micro-electro-mechanical capacitive switch of claim 11, wherein said RF transmission line is a co-planar waveguide (CPW) and said signal and ground lines are arranged on a supporting layer; said dielectric region locally coating said signal line, and said movable electrode being mechanically anchored to said ground line and crossing over said signal line as a bridge.

13. The micro-electro-mechanical capacitive switch of claim 12, wherein said movable electrode is configured to be suspended over said intermediate electrode in the first operating condition and to contact said intermediate electrode in the second operating condition, a short-circuit being established between said movable electrode and said intermediate electrode in said second operating condition; and wherein a first capacitance value, allowing passage of a RF signal through said signal line, is associated to said first operating condition, and a second capacitance value, higher than said first capacitance value and blocking said RF signal, is associated to said second operating condition.

14. The micro-electro-mechanical capacitive switch of claim 11, wherein said external actuation is an actuation voltage applied between said signal and ground lines; said actuation voltage being superimposed to a RF signal in said signal line.

15. The micro-electro-mechanical capacitive switch of claim 11, arranged as a shunt switch between said signal and ground lines.

16. A process for manufacturing a micro-electro-mechanical variable capacitor, comprising:
forming a first electrode on a supporting layer;
forming a second electrode, suspended over said first electrode and free to move with respect to said first electrode;
forming a dielectric region on said first electrode; and
forming a fixed intermediate electrode on said dielectric region separated from the second electrode, wherein the second electrode is free to move into electrical contact with the intermediate electrode.

17. The process of claim 16, wherein forming an intermediate electrode includes depositing, in particular evaporating or sputtering, a metallic material on said dielectric region.

18. A process for manufacturing a micro-electro-mechanical variable capacitor, comprising:
forming a first electrode;
forming a dielectric region on said first electrode;
forming a fixed intermediate electrode on said dielectric region; and
forming a second electrode, configured to be spaced apart from the intermediate electrode at a distance varying according to a first external actuation and configured to electrically contact the intermediate electrode in response to a second external actuation.

19. The process of claim 18, wherein forming an intermediate electrode includes depositing, in particular evaporating or sputtering, a metallic material on said dielectric region.

* * * * *